United States Patent
Wu et al.

(10) Patent No.: US 7,554,807 B2
(45) Date of Patent: Jun. 30, 2009

(54) HEAT SINK HAVING PROTECTIVE DEVICE FOR THERMAL INTERFACE MATERIAL SPREAD THEREON

(75) Inventors: Yi-Qiang Wu, Shenzhen (CN); Chun-Chi Chen, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 167 days.

(21) Appl. No.: 11/309,592

(22) Filed: Aug. 28, 2006

(65) Prior Publication Data

US 2007/0217161 A1 Sep. 20, 2007

(30) Foreign Application Priority Data

Mar. 16, 2006 (CN) .......................... 200610034553

(51) Int. Cl.
H05K 7/20 (2006.01)
(52) U.S. Cl. .................. 361/705; 361/704; 361/709; 361/710
(58) Field of Classification Search ................. 361/704, 361/705, 709, 710
See application file for complete search history.

(56) References Cited

U.S. PATENT DOCUMENTS

| | | | | |
|---|---|---|---|---|
| 5,168,926 A * | 12/1992 | Watson et al. | ................ | 165/185 |
| 5,897,917 A * | 4/1999 | Hinshaw et al. | ............. | 422/258 |
| 6,029,740 A | 2/2000 | Lee et al. | | |
| 6,049,458 A * | 4/2000 | Lee et al. | ..................... | 361/705 |
| 6,059,116 A * | 5/2000 | Hinshaw et al. | ............. | 206/714 |
| 6,644,395 B1 * | 11/2003 | Bergin | ........................ | 165/185 |
| 6,881,265 B2 * | 4/2005 | Makley et al. | .............. | 118/211 |
| 6,935,420 B1 * | 8/2005 | Dong et al. | ................. | 165/185 |
| 6,945,312 B2 * | 9/2005 | Czubarow et al. | .......... | 165/80.3 |
| 7,051,790 B2 * | 5/2006 | Lin | .......................... | 165/80.2 |
| 7,068,512 B2 * | 6/2006 | Lee et al. | ..................... | 361/704 |
| 7,068,514 B2 * | 6/2006 | Chang et al. | ................. | 361/705 |
| 7,319,592 B2 * | 1/2008 | Wang et al. | ................. | 361/705 |
| 7,349,210 B2 * | 3/2008 | Sheng et al. | ................. | 361/695 |
| 7,365,983 B2 * | 4/2008 | Huang et al. | ................. | 361/704 |
| 2002/0163076 A1 * | 11/2002 | Tzeng et al. | ................ | 257/720 |
| 2006/0042787 A1 * | 3/2006 | Yu et al. | ..................... | 165/185 |
| 2006/0232936 A1 * | 10/2006 | Wu | .............................. | 361/704 |
| 2007/0012421 A1 * | 1/2007 | Lin et al. | .................... | 165/80.2 |

FOREIGN PATENT DOCUMENTS

CN 2877207 Y 3/2007
TW M291202 5/2006

* cited by examiner

*Primary Examiner*—Anatoly Vortman
(74) *Attorney, Agent, or Firm*—Frank R. Niranjan

(57) ABSTRACT

A protective device (10) comprises a cap (100) and a strap (120) connecting with the cap (100). The cap (100) defines a cavity (102) which is adapted for accommodating thermal interface material (300) spread on a bottom surface (204) of a heat sink (200). At least three sides of the heat sink (200) are encircled by the strap (120), thereby the cap (100) is firmly attached to the heat sink (200) via the strap (120).

10 Claims, 10 Drawing Sheets

HEAT SINK HAVING PROTECTIVE DEVICE FOR THERMAL INTERFACE MATERIAL SPREAD THEREON

FIELD OF THE INVENTION

The present invention relates generally to a protective device, and particularly to a cover for a heat sink to protect thermal interface material spread on the heat sink from contamination before the heat sink is assembled to a CPU or CPU module.

DESCRIPTION OF RELATED ART

Electronic devices such as central processing units (CPUs) generate a lot of heat during normal operation. If the heat generated by the electronic devices is not properly dissipated, it can deteriorate their operational stability and damage associated electronic devices. Thus the heat must be quickly and efficiently removed to ensure the normal operation of these electronic devices. A heat dissipation device is often attached onto a top surface of a CPU, to remove heat therefrom. Gaps inevitably exist between the heat dissipation device and the CPU and hence causes reduction of heat transferring efficiency from the CPU to the heat dissipation device due to poor heat-transmission through air in the gaps. To ensure intimate contact between the CPU and the heat dissipation device, a layer of thermal interface material is usually spread on a heat absorption surface of a heat sink to improve heat-transmission between the heat sink and the CPU. The heat generated by the CPU causes the thermal interface material to become more liquid, enabling the thermal interface material to fill in the air gap formed between the heat sink and the CPU, thereby improving heat-transmission efficiency between the heat sink and the CPU.

However, the thermal interface material cannot be applied to the heat sink in advance since it is not solid at room temperature and may contaminate surrounding articles or be contaminated by dust or foreign particles before the heat sink is attached to the CPU. To overcome the above problem, various protective devices have been developed. The protective devices are attached onto a bottom surface of a heat sink to enclose the thermal interface material spread on the bottom of the heat sink. The thermal interface material thus protected cannot be contaminated by dust or foreign particles, and does not contaminate surrounding articles when the heat sink is transported or handled. By using the protective device, the thermal interface material can be applied to the heat sink in advance, thereby simplifying the process of attachment of the heat sink to the CPU. FIG. 10 discloses a related protective device mounted on a bottom portion of a heat sink. The bottom portion of the heat sink is engaged in a space enclosed by side walls of the protective device. However, the protective device is prone to being loosened from the bottom portion of the heat sink during transport. Furthermore, the protective device needs to enclose parts of the heat sink which do not have a layer of thermal interface material, thus wasting of material.

SUMMARY OF THE INVENTION

According to a preferred embodiment of the present invention, a protective device comprises a cap and a strap connecting with the cap. The cap defines a cavity which is adapted for accommodating thermal interface material. At least three sides of the heat sink are encircled by the strap, whereby the cap is firmly attached onto the heat sink via the strap.

Other advantages and novel features of the present invention will become more apparent from the following detailed description of the preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
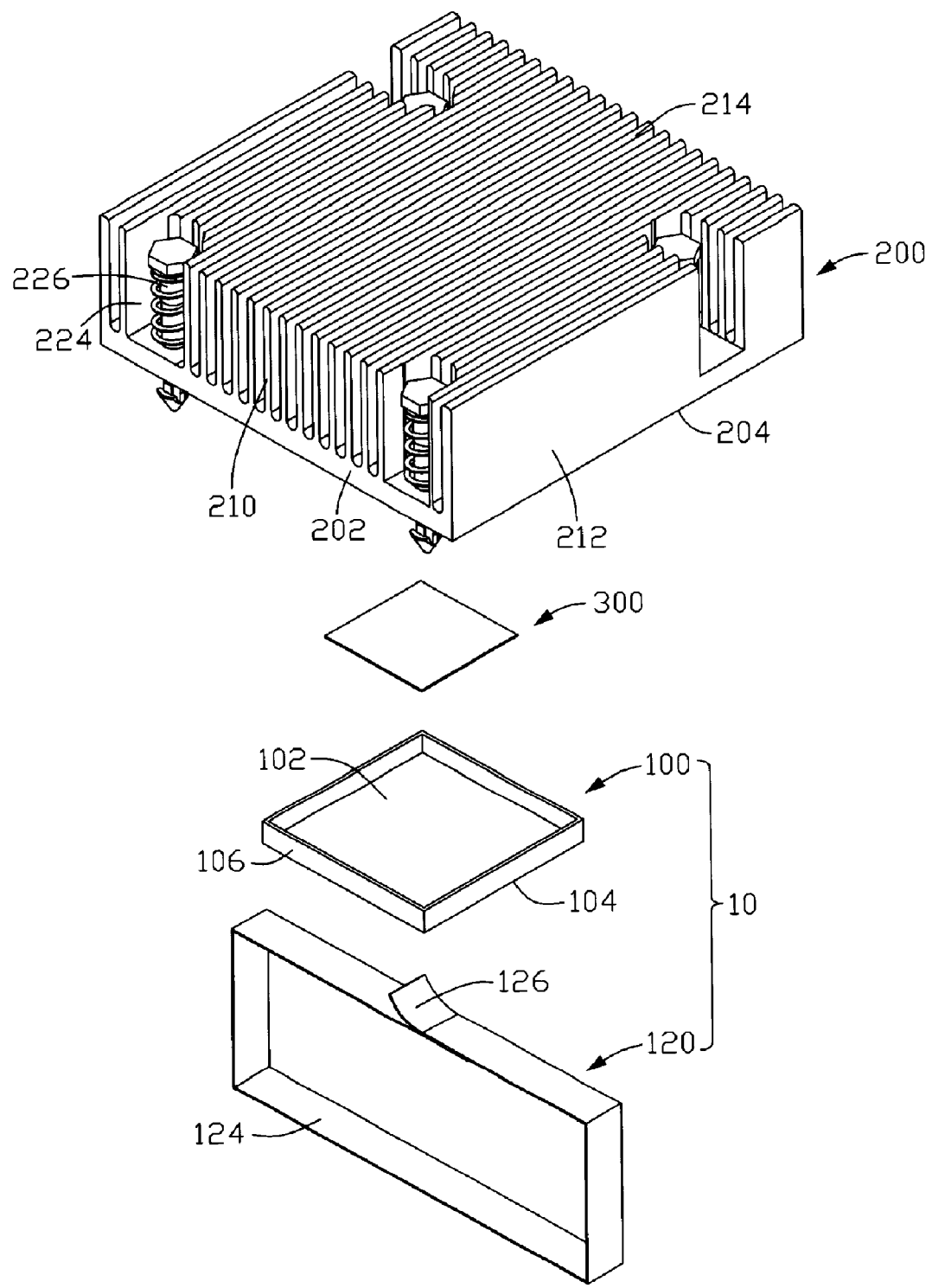
FIG. 1 is an exploded, isometric view of a protective device according to a preferred embodiment of the present invention and a heat sink.

Referring to FIG. 1, a protective device 10 in accordance with a preferred embodiment of the present invention comprises a cap 100 and a strap 120 connecting with the cap 100. A cavity 102 is defined in the middle of the cap 100 and adapted to enclose thermal interface material, such as thermal interface material 300 spread onto a bottom surface 204 of a heat sink 200.

The cap 100 is made of plastic or metal. The cap 100 integrally comprises a square top wall 104 and four side walls 106 each extending perpendicularly from a separate one of four edges of the top wall 104. The top wall 104 and the side walls 106 cooperatively define the cavity 102. The strap 120 has an adhesive surface 124 thereon. A tab 126 is formed at a distal end of the strap 120 and may serve as a handle.

The heat sink 200 comprises a square base 202 and defines the bottom surface 204 adapted to contact a CPU (not shown) for absorbing heat generated by the CPU. A plurality of parallel fins 210 extend upwardly from another surface opposite to the bottom surface 204 of the heat sink 200 for dissipating heat from the base 202 of the heat sink 200 to ambient air. Distal ends (not labeled) of the fins 210 commonly form a top portion 214 of the heat sink 200. Two opposite lateral walls 212 of the heat sink 200 are each formed by one of the outmost two of the fins 210.

Four receiving spaces 224 are defined at four corners of the heat sink 200. A through hole (not labeled) is defined at each corner of the heat sink 200, located at a position corresponding to each of the receiving spaces 224. Four fasteners 226 extend through the four through holes to attach the heat sink 200 onto a printed circuit board (not shown) having the CPU mounted thereon.

Figure 2:
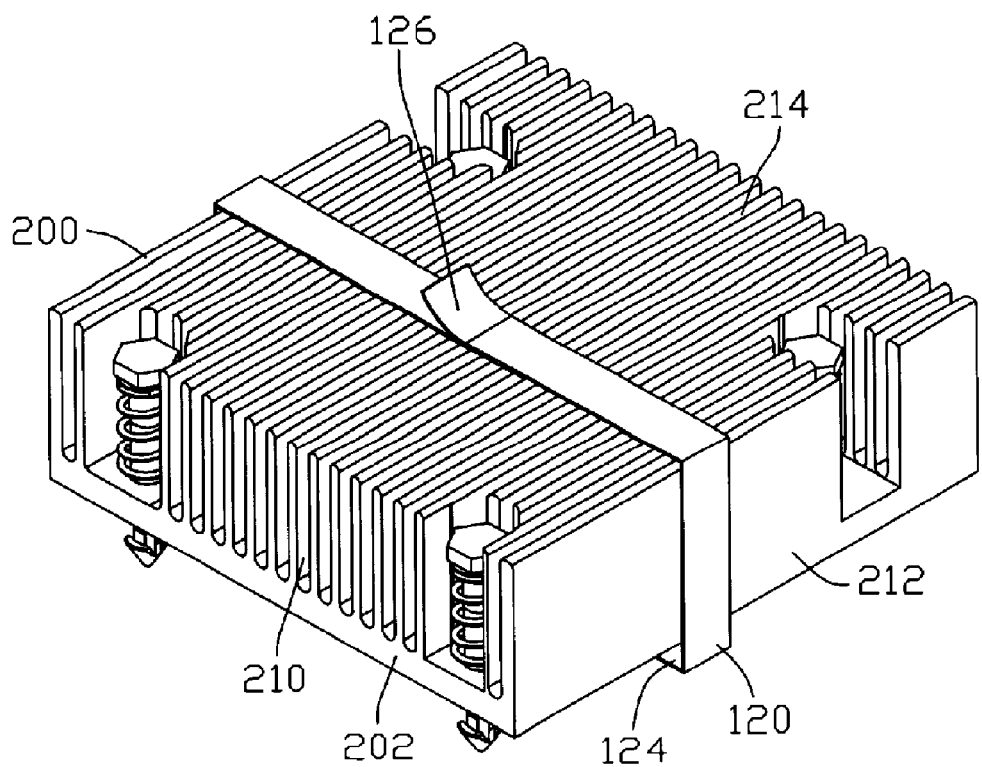
FIG. 2 is an assembled, isometric view of FIG. 1.
Figure 3:
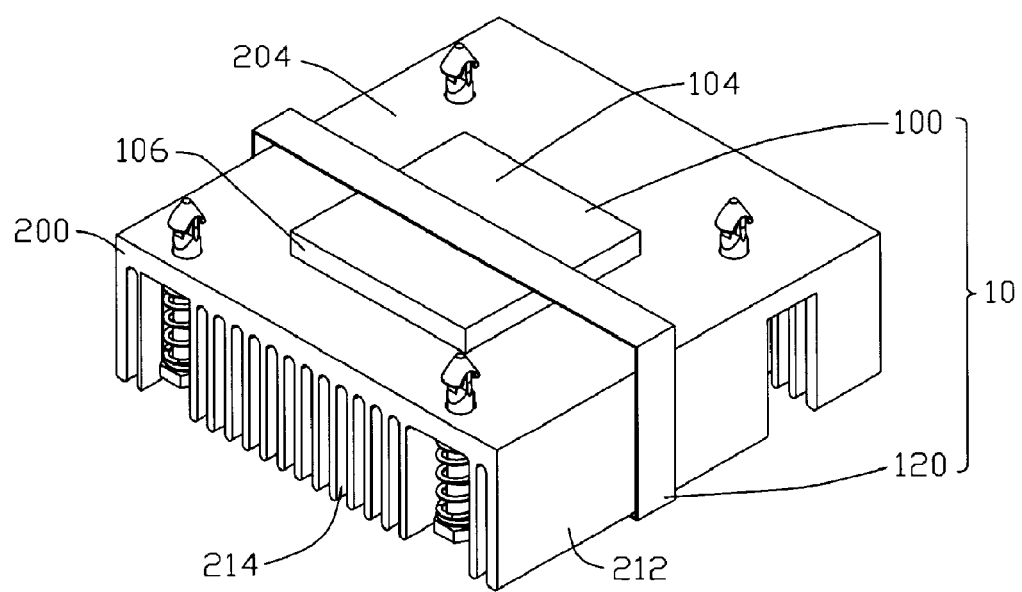
FIG. 3 is a view similar to FIG. 2, but shown from an opposite bottom aspect.

Referring to FIG. 2 and FIG. 3, the cap 100 is disposed on the bottom surface 204 of the base 202 of the heat sink 200 to enclose the thermal interface material 300 spread on the middle of the bottom surface 204. The cavity 102 receives the thermal interface material 300 therein. The adhesive surface 124 of the strap 120 rests on the middle portion of the cap 100 along a direction perpendicular to the lateral walls 212 of the heat sink 200. The adhesive surface 124 also further contacts and encloses the lateral walls 212 and the top portion 214 of the heat sink 200, thereby forming a closed loop enclosing outer peripheral surfaces of the cap 100 and the heat sink 200. One distal end of the strap 120 and the other end adjacent to the tab 126 of the strap 120 are joined with adhesive at a middle of the top portion 214. Thus, the cap 100 is positioned between the strap 120 and the bottom surface 204 of the base 202 of the heat sink 200 so that the cap 100 is firmly attached onto the heat sink 200 by the strap 120. The tab 126 is adapted to facilitate detachment of the cap 100 from the heat sink 200 by manual detaching the two ends of the strap 120.

Figure 4:
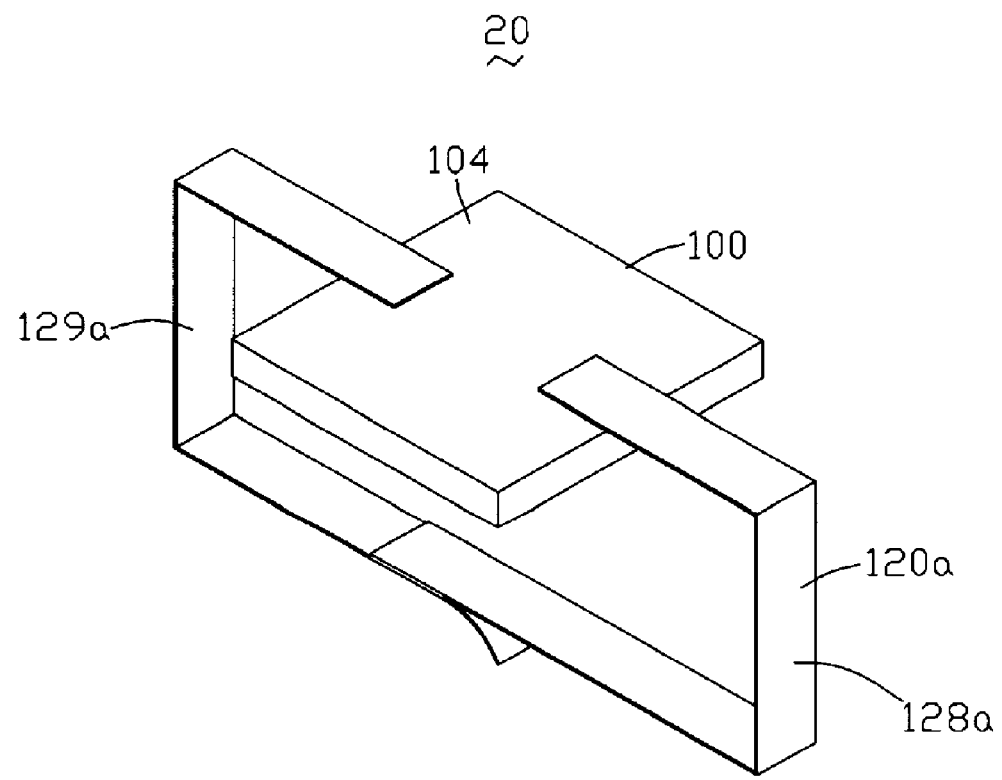
FIG. 4 is an assembled, isometric view of a protective device according to a second embodiment of the present invention.
Figure 5:
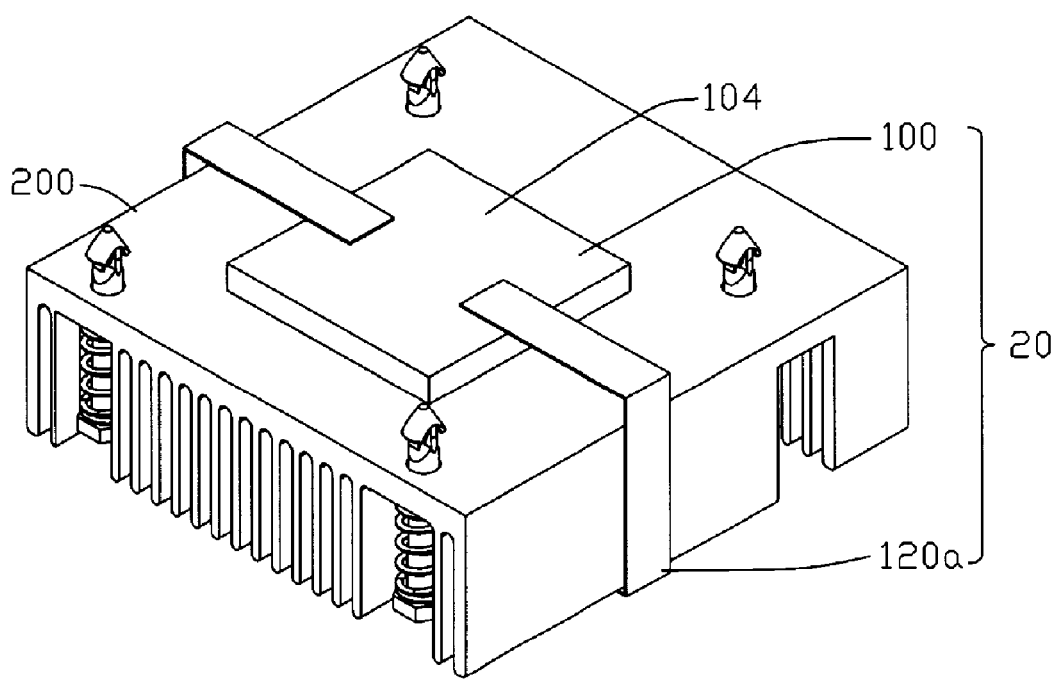
FIG. 5 is an assembled, isometric view of a heat sink and the protective device shown in FIG. 4.

Referring to FIG. 4 and FIG. 5, a protective device 20 in accordance with a second embodiment of the present invention is illustrated. The protective device 20 of the second embodiment has a configuration similar to that of the first embodiment. The protective device 20 comprises a cap 100 having the same configuration as the first embodiment and a strap 120a. A main difference is that in the second embodiment the strap 120a is disconnected and cut into two parts 128a, 129a at the top wall 104 of the cap 100. Only two opposite ends of the two parts 128a, 129a are adhered to the top wall 104 of the cap 100, thereby forming a half-closed loop enclosing outer peripheral surfaces of the cap 100 and the heat sink 200.

Figure 6:
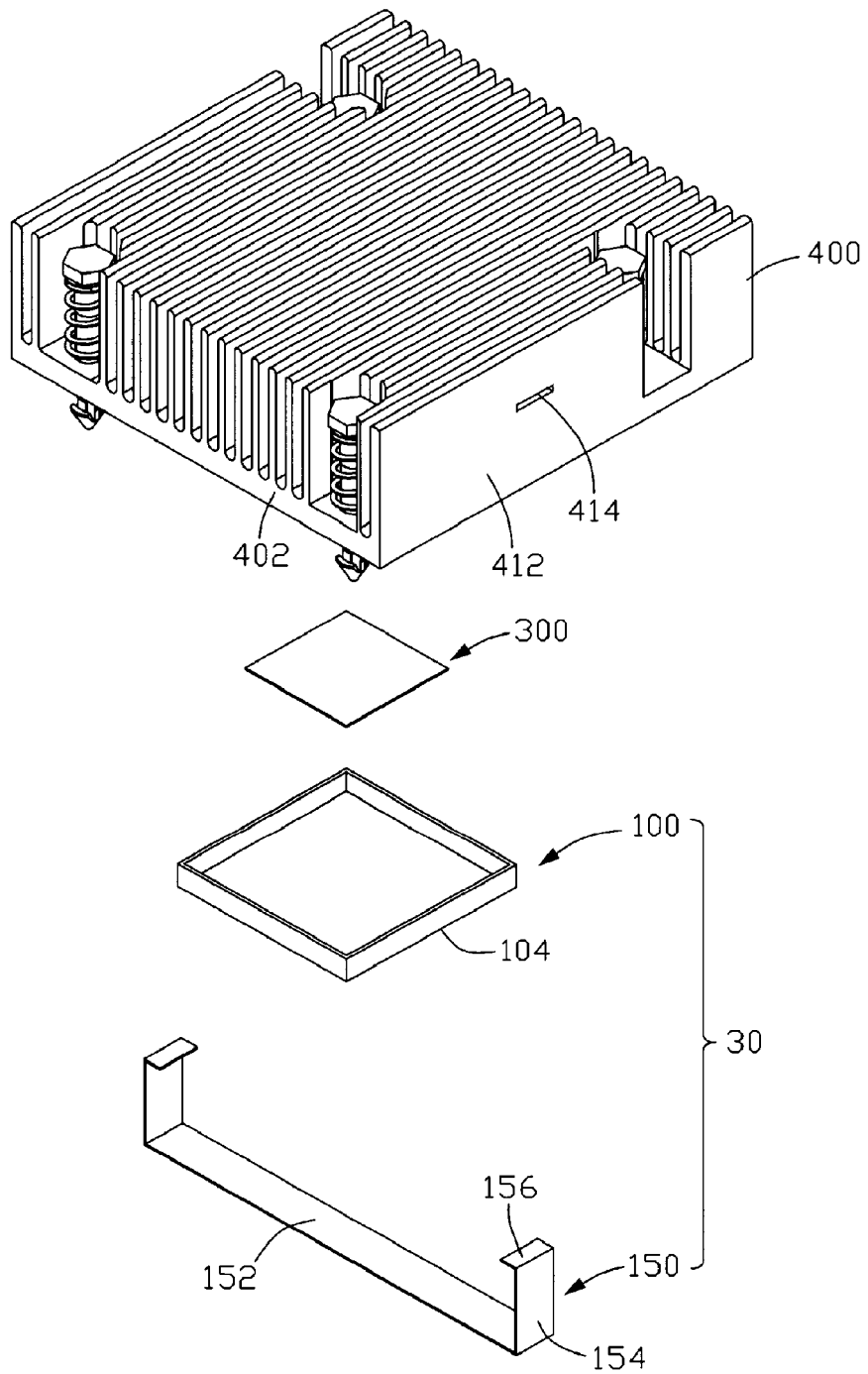
FIG. 6 is an exploded, isometric view of a protective device according to a third embodiment of the present invention and a heat sink.

Referring to FIG. 6, a protective device 30 in accordance with a third embodiment of the present invention is illustrated. The protective device 30 comprises a cap 100 and a strap 150. The cap 100 is used for protecting the thermal interface material 300 spread on a base 402 of a heat sink 400. The heat sink 400 defines two locking holes 414 in two opposite lateral walls 412 of the heat sink 400. The strap 150 can be made of a material chosen from the group consisting of rigid plastic and a metallic sheet. The strap 150 comprises a body 152 with a pair of opposite arm portions 154 extending perpendicularly from two ends of the body 152. A pair of opposite engaging portions 156 are inwardly and perpendicularly bent from distal ends of the arm portions 154 for being engaged in the two locking holes 414 of the heat sink 400, thereby firmly attaching the protective device 30 onto the heat sink 400.

Figure 7:
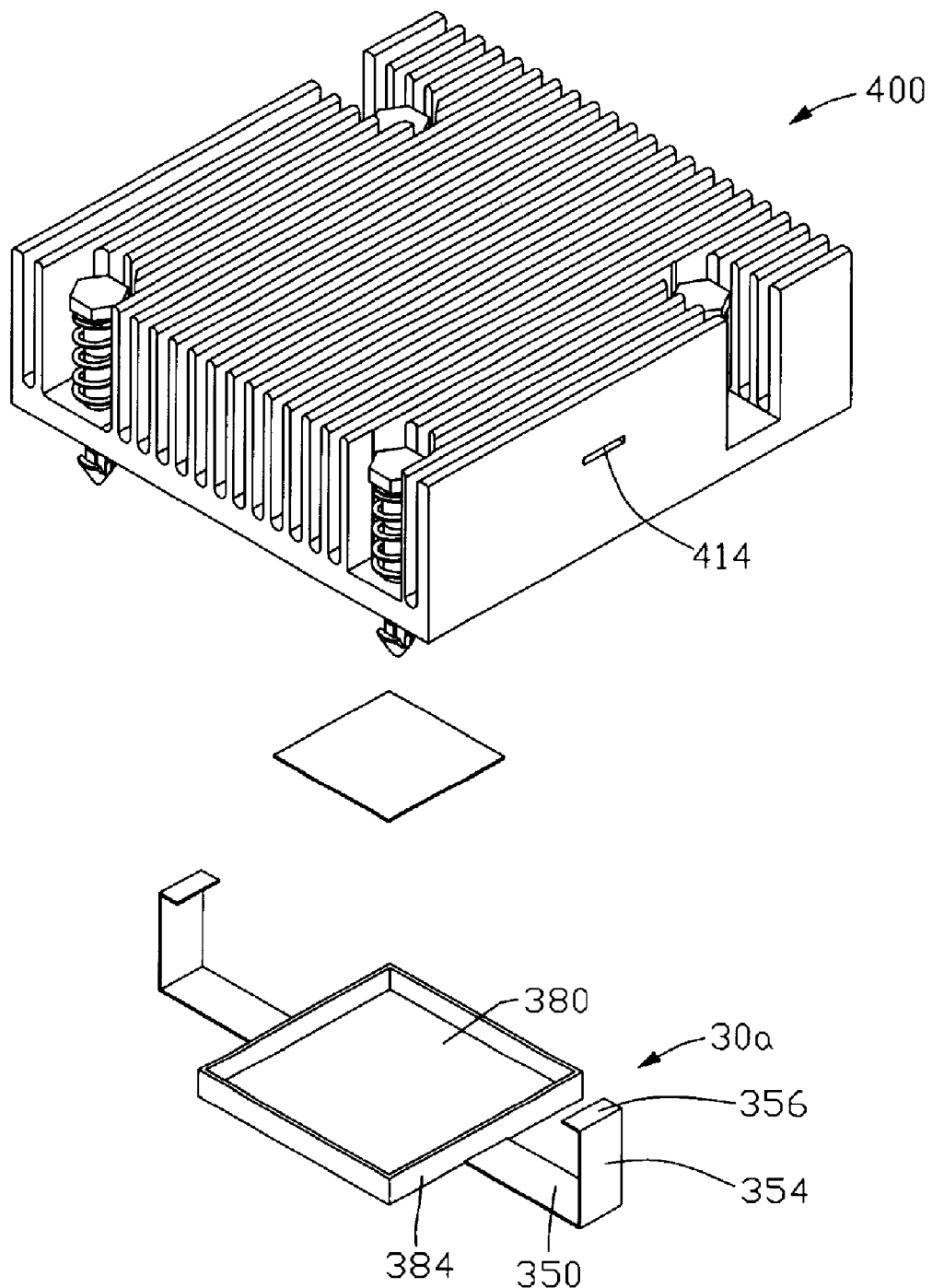
FIG. 7 is an exploded, isometric view of a protective device according to a fourth embodiment of the present invention and a heat sink.

Referring to FIG. 7, a protective device 30a in accordance with a fourth embodiment of the present invention is illustrated. The protective device 30a comprises a cap 380 similar to the cap 100 and two straps 350 integrally extending perpendicularly from two opposite side walls 384 of the cap 380. Each strap 350 comprises an arm portion 354 and an engaging portion 356 having the same structures as the arm portions 154 and the engaging portion 156 of the protective device 30 of the third embodiment.

Figure 8:
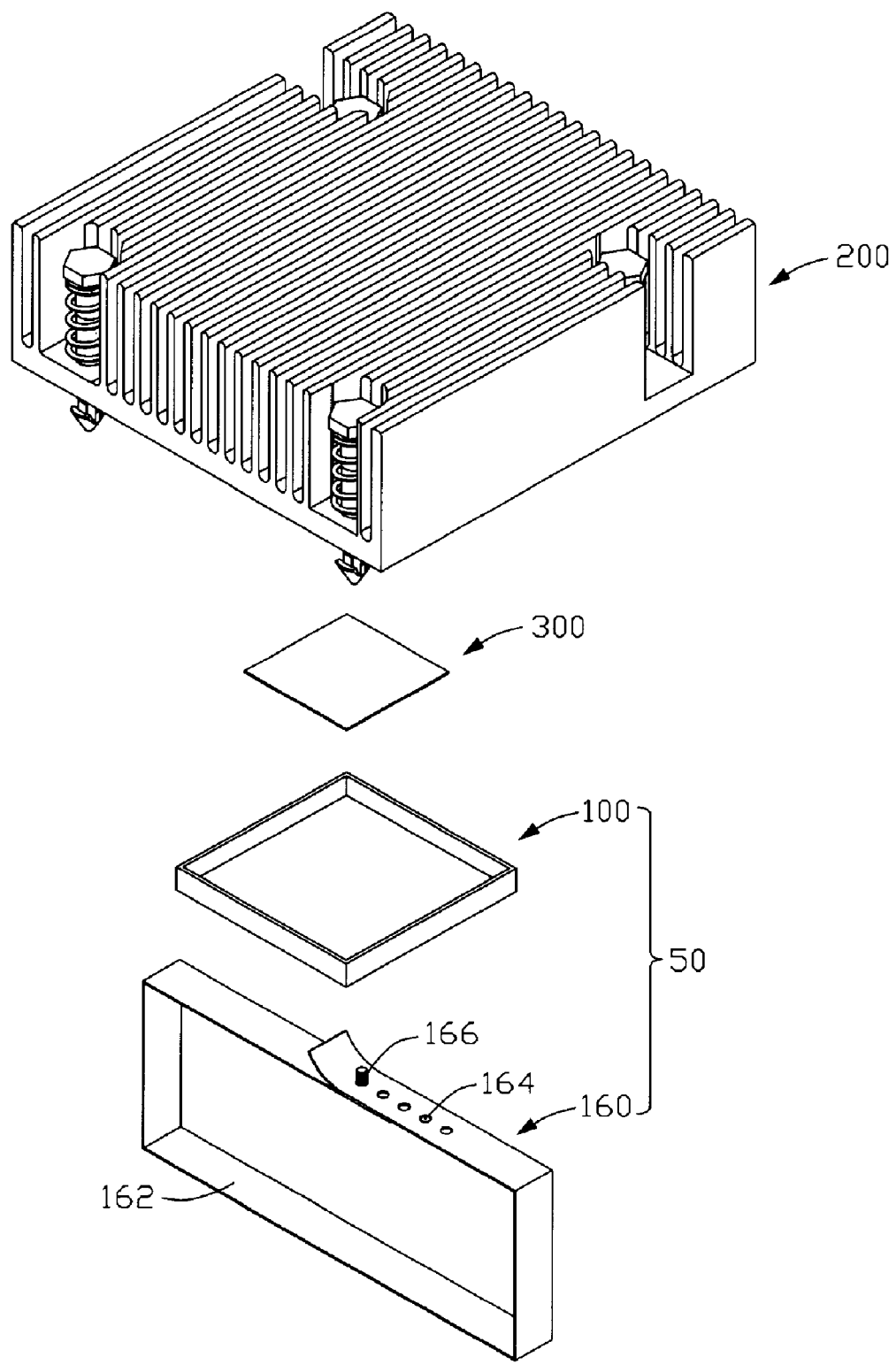
FIG. 8 is an exploded, isometric view of a protective device according to a fifth embodiment of the present invention and a heat sink.

Referring to FIG. 8, a protective device 50 in accordance with a fifth embodiment of the present invention is illustrated. A main difference between the protective device 50 of this embodiment and the protective device 10 of the first embodiment is that a strap 160 replaces the strap 120. The strap 160 comprises a body 162. A plurality of holes 164 are defined in an upper side of the body 162. A pin 166 extending upwardly from the other end of the body 162 can be selectively engaged in the holes 164 to form a loop encircling the heat sink 200 to attach the cap 100 onto the heat sink 200.

Figure 9:
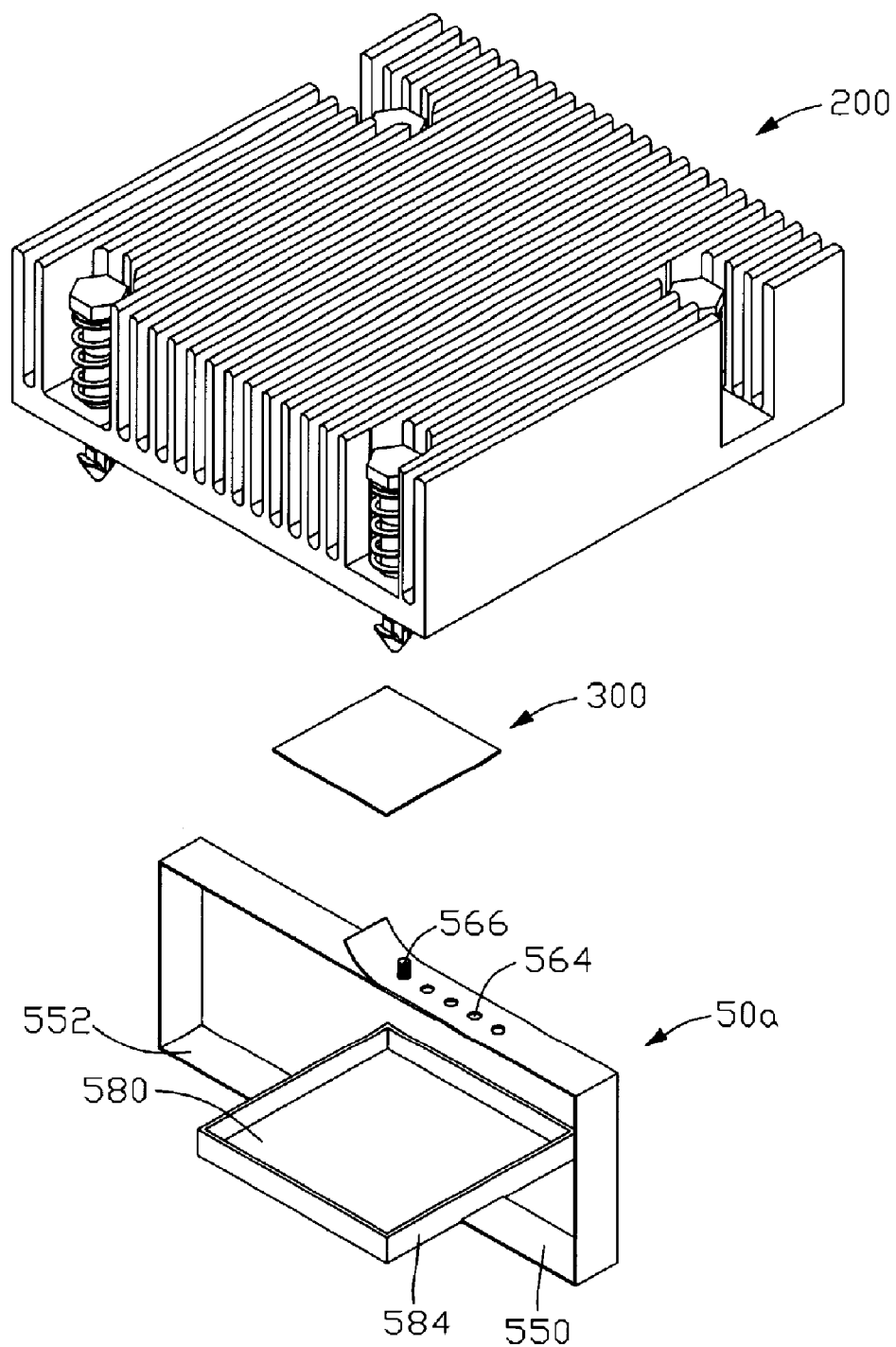
FIG. 9 is an exploded, isometric view of a protective device according to a sixth embodiment of the present invention and a heat sink.
Figure 10:
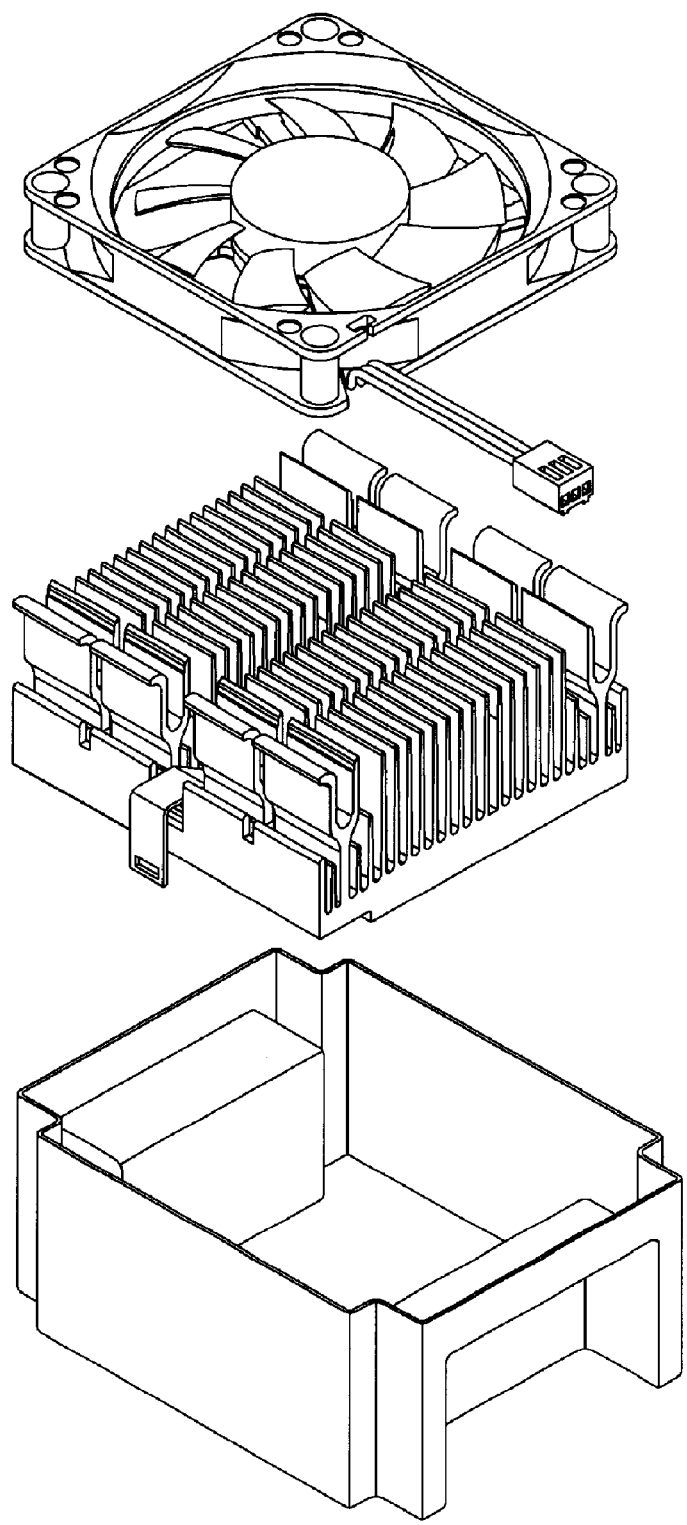
FIG. 10 is an exploded, isometric view of a protective device and a heat sink in accordance with related art.

Referring to FIG. 9, a protective device 50a in accordance with a sixth embodiment of the present invention is illustrated. The protective device 50a comprises a cap 580 and two straps 550, 552 extending perpendicularly from two opposing side walls 584 of the cap 580. A free end of the strap 550 defines a plurality of holes 564 and an end of the strap 552 defines a pin 566. The pin 566 is engaged in one of the holes 564 to form a loop encircling the heat sink 200 to attach the cap 580 on the heat sink 200.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A protective device for protecting thermal interface material spread on a heat sink, comprising:
   a cap comprising a top wall and side walls extending perpendicularly from edges of the top wall, the top wall and the side walls cooperatively defining a cavity for receiving the thermal interface material therein; and
   at least a strap connected with the cap and being for intimately contacting at least three peripheral sides of the heat sink to attach the cap onto the heat sink;
   wherein the at least a strap and the cap cooperatively form a closed loop for encircling the heat sink.

2. The protective device as claimed in claim 1, wherein the at least a strap has an adhesive surface adhered on the top wall of the cap and a tab at an end thereof.

3. The protective device as claimed in claim 2, wherein the end of the at least a strap where the tab is located and another end of the at least a strap are joined with each other by adhesive thus forming a closed loop for encircling the heat sink, the tab being formed for facilitating separation of the two ends of the at least a strap.

4. The protective device as claimed in claim 2, wherein the at least a strap has a number of two and the two straps are each adhered to the cap at one end thereof, another end of each of the two straps being connected with each other.

5. The protective device as claimed in claim 1, wherein the at least a strap has an adhesive surface adhering to the top wall of the cap, a pin formed at an end thereof and holes defined in another end of the at least a strap, the pin being selectively inserted into the holes.

6. The protective device as claimed in claim 1, wherein the at least a strap has a number of two and the two straps integrally extend from the side walls of the cap, respectively.

7. The protective device as claimed in claim 6, wherein one of the two straps has a pin formed at a distal end thereof and the other of the two straps has a plurality of holes defined a distal end thereof, the pin is inserted in one of the holes.

8. A combination for dissipating heat generated by an electronic device, comprising:
   a heat sink comprising a base for contacting with the electronic device and thermal interface material applied onto a surface of the base;

a cap disposed on the surface of the base and enclosing the thermal interface; and two straps connected with the cap and covering at least three sides of the heat sink so as to attach the cap to the surface of the base of the heat sink;

wherein the cap comprises a top wall and side walls extending perpendicularly from edges of the top wall, the top wall and the side walls cooperatively define a cavity receiving the thermal interface material therein;

wherein the two straps each have an adhesive surface which adheres to the top wall of the cap;

wherein the two straps are each adhered to the cap at one end thereof, another end of each of the two straps being connected with each other, thus forming a half-closed loop encircling an outer surface of the heat sink.

9. The combination as claimed in claim 8, wherein one of the two straps has a pin formed at a distal end thereof and the other of the two straps has a plurality of holes defined in a distal end thereof, the pin is inserted in one of the holes.

10. A protective device for protecting thermal interface material spread on a heat sink, comprising:

a cap comprising a top wall and side walls extending perpendicularly from edges of the top wall, the top wall and the side walls cooperatively defining a cavity for receiving the thermal interface material therein; and two straps each connected with the cap and being for intimately contacting at least three peripheral sides of the heat sink to attach the cap onto the heat sink;

wherein the two straps each have an end with an adhesive surface adhered on the top wall of the cap, another end of each of the two straps is connected with each other, and a tab is formed at the another end of one of the two straps for facilitating separation of the two another ends of the two straps.

* * * * *